(12) United States Patent
Sawano et al.

(10) Patent No.: US 10,879,689 B2
(45) Date of Patent: Dec. 29, 2020

(54) POWER SUPPLY CONTROL APPARATUS

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Shunichi Sawano, Mie (JP); Yuuki Sugisawa, Mie (JP); Kota Oda, Mie (JP); Keisuke Mase, Mie (JP)

(73) Assignees: AutoNetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 268 days.

(21) Appl. No.: 15/776,598

(22) PCT Filed: Nov. 30, 2016

(86) PCT No.: PCT/JP2016/085519
§ 371 (c)(1),
(2) Date: May 16, 2018

(87) PCT Pub. No.: WO2017/094762
PCT Pub. Date: Jun. 8, 2017

(65) Prior Publication Data
US 2018/0358800 A1 Dec. 13, 2018

(30) Foreign Application Priority Data
Dec. 3, 2015 (JP) .................. 2015-236933

(51) Int. Cl.
*H02H 5/04* (2006.01)
*H02H 1/00* (2006.01)
(Continued)

(52) U.S. Cl.
CPC .......... *H02H 5/047* (2013.01); *H02H 1/0007* (2013.01); *H02H 3/20* (2013.01);
(Continued)

(58) Field of Classification Search
CPC ............ H02H 5/047; H02H 5/04; H02H 3/20; H02H 1/0007; H02H 3/087; H02H 6/00; H02H 3/093; G01K 2217/00
See application file for complete search history.

(56) References Cited

U.S. PATENT DOCUMENTS 5,448,175 A  9/1995 Nishibe et al.
5,585,994 A  12/1996 Tamai et al.
(Continued)

FOREIGN PATENT DOCUMENTS

| DE | 3429381 A1 | 2/1986 |
|---|---|---|
| JP | H03-265418 A | 11/1991 |
| JP | 2009-142146 A | 6/2009 |

OTHER PUBLICATIONS

Extended European Search Report, Application No. EP 16 87 0699.2, dated Dec. 6, 2018.
Search Report for PCT/JP2016/085519, dated Feb. 7, 2017.

*Primary Examiner* — Kyle J Moody
(74) *Attorney, Agent, or Firm* — Honigman LLP (57) ABSTRACT

A control circuit turns ON or OFF a switch that is provided at a midpoint of a wire. Thus, power supply via the wire is controlled. A current output circuit outputs a current that corresponds to a current flowing through the wire to a resistance circuit. In the resistance circuit, a series circuit of a resistor (R2) and a capacitor (C1) is connected in parallel to a resistor (R1). The control circuit) turns OFF the switch if the end-to-end voltage value of a voltage across both ends of the resistance circuit is larger than or equal to a reference voltage value.

4 Claims, 6 Drawing Sheets

(51) Int. Cl.
*H02H 3/20* (2006.01)
*H02H 3/087* (2006.01)
*H02H 6/00* (2006.01)
*H02H 3/093* (2006.01)

(52) U.S. Cl.
CPC ........... *H02H 5/04* (2013.01); *G01K 2217/00* (2013.01); *H02H 3/087* (2013.01); *H02H 3/093* (2013.01); *H02H 6/00* (2013.01)

(56) References Cited

U.S. PATENT DOCUMENTS

| | | | |
|---|---|---|---|
| 7,378,805 B2 * | 5/2008 | Oh | H05B 45/20 |
| | | | 315/291 |
| 9,577,522 B2 * | 2/2017 | Jayawant | H02M 3/157 |
| 10,770,884 B2 * | 9/2020 | Sawano | H02H 1/043 |
| 2003/0072120 A1 | 4/2003 | Ishikawa et al. | |
| 2012/0176115 A1 | 7/2012 | Higuchi et al. | |
| 2012/0229942 A1 | 9/2012 | Hussein et al. | |
| 2015/0029631 A1 | 1/2015 | Nakamura et al. | |
| 2019/0245431 A1 * | 8/2019 | Chung | H02M 3/156 |
| 2019/0260200 A1 * | 8/2019 | Sawano | H02H 7/1213 |

* cited by examiner

POWER SUPPLY CONTROL APPARATUS

CROSS-REFERENCE TO RELATED APPLICATIONS

This application is the U.S. national stage of PCT/JP2016/085519 filed Nov. 30, 2016, which claims priority of Japanese Patent Application No. 2015-236933 filed on Dec. 3, 2015, which is incorporated herein by reference in its entirety.

FIELD OF THE INVENTION

The present description relates to a power supply control apparatus for controlling power supply via a wire by turning ON and OFF a switch that is provided at a midpoint of the wire.

BACKGROUND OF THE INVENTION

Currently, vehicles are equipped with a power supply control apparatus (e.g. see JP 2015-53761A) for controlling power supply from a battery to a load. The power supply control apparatus described in JP 2015-53761A controls power supply from a battery to a load by turning ON and OFF a switch that is provided at a midpoint of a wire that connects the battery to the load.

Furthermore, a control circuit turns OFF the switch if the current value of a current flowing through the wire is larger than or equal to a current threshold. This configuration does not allow a current whose current value is larger than or equal to the current threshold to flow through the wire, and it is accordingly possible to prevent an abnormal increase in the wire temperature due to an overcurrent, and occurrence of smoke and fire from the wire due to this abnormal increase in the wire temperature.

SUMMARY OF THE INVENTION

In a configuration in which power is supplied to a load whose resistance value is very small when a current starts to flow and increases as the current flowing time is longer, a large current temporarily flows through the wire when the control circuit turns ON the switch from the OFF state. This current is called "inrush current".

If the current value of the aforementioned current threshold is set to the current value of the inrush current or smaller, the switch turns ON and then returns to the OFF state immediately thereafter, and accordingly the load does not work. To operate the load, the current threshold needs to be set to a value that exceeds the current value of the inrush current.

The wire temperature is low when the switch is turned ON from the OFF state. For this reason, even if an inrush current flows through the wire, the wire temperature does not increase abnormally. Accordingly, the current threshold may exceed the current value of the inrush current immediately after the switch turned ON from the OFF state.

However, after an inrush current has flown, a current has flown through the wire for a certain period or more, and the wire temperature has exceeded a certain temperature. For this reason, after an inrush current has flown through the wire, if a current whose current value is the same as that of the inrush current flows through the wire, there is a possibility that the wire temperature will increase abnormally. Accordingly, after an inrush current has flown through the wire, the current threshold needs to be set to a value smaller than or equal to the inrush current value.

The present description has been made in view of the foregoing situation, and aims to provide a power supply control apparatus capable of reliably preventing an abnormal increase in a wire temperature due to an overcurrent, while allowing an inrush current to flow through a wire immediately after a switch is turned ON from the OFF state.

A power supply control apparatus according to the present description is a power supply control apparatus that includes a switch control portion that turns ON or OFF a switch provided at a midpoint of a wire, and controls power supply via the wire by the switching with the switch control portion, the power supply control apparatus including: a current output circuit for outputting a current corresponding to a current flowing through the wire; and a resistance circuit through which the current output by the current output circuit flows, wherein the resistance circuit includes: a first resistor; and a series circuit of a second resistor and a capacitor that are connected in parallel to the first resistor, and the switch control portion turns OFF the switch if an end-to-end voltage value of a voltage across both ends of the resistance circuit is larger than or equal to a predetermined voltage value.

In the present description, for example, a current whose current value increases with an increase in the current value of a current flowing through the wire is output from the current output circuit to the resistance circuit. In the resistance circuit, the series circuit of the second resistor and the capacitor is connected in parallel to the first resistor. If the end-to-end voltage value of the voltage across both ends of the resistance circuit is larger than or equal to the predetermined voltage value, the switch is turned OFF, and power supply via the wire is stopped.

The current value of the current that flows through the wire when the end-to-end voltage value of the resistance circuit is the predetermined voltage value, i.e. a current threshold depends on the power that is stored in the capacitor. When no power is stored in the capacitor, the resistance value of the resistance circuit is a combined resistance value of the first resistor and the second resistor that are connected in parallel. The resistance value of the resistance circuit increases as the amount of power stored in the capacitor increases. The largest value of the resistance value of the resistance circuit corresponds to the resistance value of the first resistor. When the amount of power stored in the capacitor is small, the resistance value of the resistance circuit is small. Accordingly, the current value, which is calculated by dividing the predetermined voltage value by the resistance value of the resistance circuit, is large, and the current threshold is also large. When the amount of power stored in the capacitor is large, the resistance value of the resistance circuit is large. Accordingly, the current value, which is calculated by dividing the predetermined voltage value by the resistance value of the resistance circuit, is small, and the current threshold is also small.

If the switch has turned ON from the OFF state, the amount of power stored in the capacitor is small, and the current threshold is large. For this reason, an inrush current is allowed to flow through the wire immediately after the switch has been turned ON from the OFF state. Furthermore, after the inrush current has flown through the wire, power is stored in the capacitor, and the current threshold is small. Accordingly, an abnormal increase in the wire temperature due to an overcurrent is reliably prevented.

The power supply control apparatus according to the present description further includes a temperature calculating portion for calculating a wire temperature of the wire based on the end-to-end voltage value, wherein the switch control portion turns OFF the switch if the wire temperature calculated by the temperature calculating portion is larger than or equal to a predetermined temperature.

In the present description, even if the current value of the current flowing through the wire temperature is smaller than the aforementioned current threshold, the switch turns OFF from the ON state when the wire temperature becomes larger than or equal to the predetermined temperature. Accordingly, an abnormal increase in the wire temperature is more reliably prevented.

The power supply control apparatus according to the present description further includes a smoothing circuit for smoothing a voltage across both ends of the resistance circuit; and a temperature calculating portion for calculating a wire temperature of the wire based on a voltage value of the voltage smoothed by the smoothing circuit, wherein the switch control portion turns OFF the switch if the wire temperature calculated by the temperature calculating portion is larger than or equal to a predetermined temperature.

In the present description, in the case where, for example, the voltage value output to the load via the wire is maintained at a fixed value by alternately repeating turning ON and OFF of the switch, the end-to-end voltage value of the resistance circuit varies in accordance with the turning ON and OFF of the switch. The smoothing circuit smooths the voltage across both ends of the resistance circuit. The switch is turned OFF if the wire temperature that is calculated based on the voltage value of the voltage smoothed by the smoothing circuit is larger than or equal to the predetermined temperature.

Accordingly, even if the current value of the current flowing through the wire is smaller than the aforementioned current threshold, the switch turns OFF from the ON state when the wire temperature becomes larger than or equal to the predetermined temperature. Accordingly, an abnormal increase in the wire temperature is more reliably prevented. Furthermore, an appropriate wire temperature is calculated even if the turning ON and OFF of the switch is alternately repeated.

The power supply control apparatus according to the present description further includes a temperature detecting portion for detecting an ambient temperature around the wire, wherein the temperature calculating portion has a temperature difference calculating portion for calculating, in time series, a temperature difference between the wire temperature and the ambient temperature detected by the temperature detecting portion, and calculates the wire temperature by adding the ambient temperature detected by the temperature detecting portion to the temperature difference calculated by the temperature difference calculating portion, the switch control portion alternately repeats the turning ON and OFF the switch, and the temperature difference calculating portion calculates a temperature difference $\Delta Tw$ by substituting, into the equations below, a voltage value Vs of the voltage smoothed by the smoothing circuit, an ambient temperature Ta detected by the temperature detecting portion, a duty ratio D associated with the turning ON and OFF of the switch, and a preceding temperature difference $\Delta Tp$ that is calculated at the previous time:

$$\Delta Tw = \Delta Tp \times \exp(-\Delta t/\tau r) + A \times Rw \times Vs^2 \times (1 - \exp(-\Delta t/\tau r))/D$$

$$Rw = Ro \times (1 + \kappa \times (Ta + \Delta Tp - To))$$

where $\Delta t$ denotes a time interval of calculation performed by the temperature difference calculating portion, Ro denotes a wire resistance value at a predetermined temperature To, $\tau r$ denotes a wire discharge time constant of the wire, $\kappa$ denotes a wire resistance/temperature coefficient of the wire, and A denotes a constant.

In the present description, the temperature difference between the wire temperature and the ambient temperature around the wire is calculated in time series, and the wire temperature is calculated by adding the ambient temperature around the wire to the calculated temperature difference. The turning ON and OFF of the switch is alternately repeated. The temperature difference $\Delta Tw$ is calculated by substituting, into the above equations, the voltage value Vs of the voltage smoothed by the smoothing circuit, the ambient temperature Ta around the wire detected by the temperature detecting portion, the duty ratio D associated with the turning ON and OFF of the switch, and the preceding temperature difference $\Delta Tp$ that is calculated at the previous time.

According to the present description, it is possible to reliably prevent an abnormal increase in the wire temperature due to an overcurrent, while allowing an inrush current to flow through the wire immediately after the switch is turned ON from the OFF state.

DETAILED DESCRIPTION OF THE PREFERRED EMBODIMENTS

Hereinafter, the present description will be described in detail based on the drawings showing the embodiments.

Embodiment 1

Figure 1:
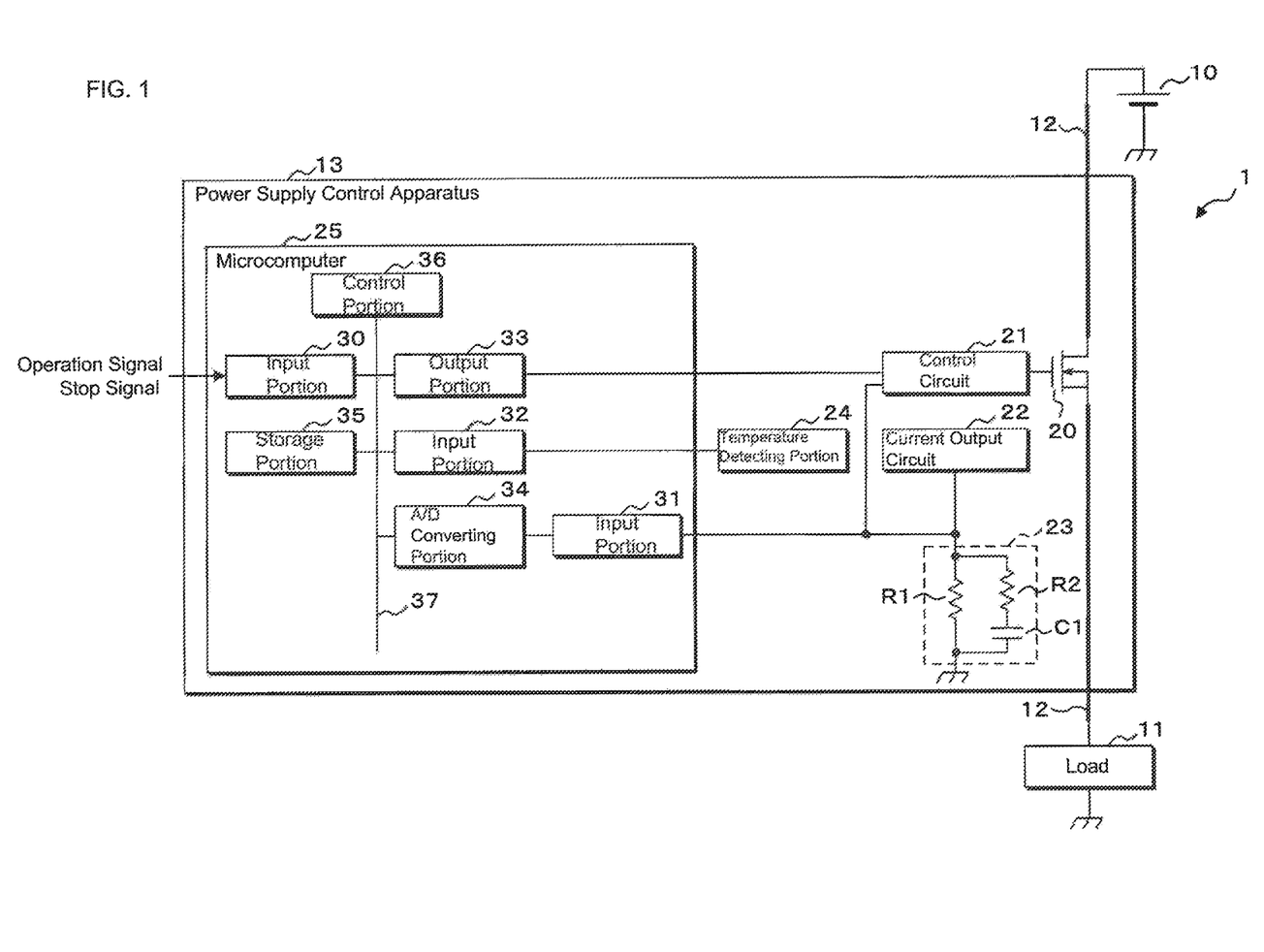
FIG. 1 is a block diagram showing a configuration of essential parts of a power supply system according to Embodiment 1.

FIG. 1 is a block diagram showing a configuration of essential parts of a power supply system 1 in Embodiment 1. The power supply system 1 is favorably mounted in a vehicle, and includes a battery 10, a load 11, and a wire 12. The positive electrode of the battery 10 is connected to one end of the load 11 by the wire 12. The negative electrode of the battery 10 and the other end of the load 11 are grounded.

Power is supplied from the battery 10 to the load 11 via the wire 12. The load 11 is an electric device, such as a lamp, that is mounted in the vehicle. The resistance value of the load 11 is very small when a current starts to flow, and increases as the current flowing time is longer. The load 11 operates while power is being supplied from the battery 10 to the load 11, and the load 11 stops operation if power supply from the battery 10 to the load 11 has stopped.

The power supply system 1 also includes a power supply control apparatus 13. The power supply control apparatus 13 is provided at a midpoint of the wire 12. An operation signal for giving an instruction to operate the load 11 and a stop signal for giving an instruction to stop operation of the load 11 are input to the power supply control apparatus 13. The power supply control apparatus 13 controls power supply to the load 11 based on the signal input to the power supply control apparatus 13, a wire current value of the current flowing through the wire 12, and the wire temperature of the wire 12.

The power supply control apparatus 13 has a switch 20, a control circuit 21, a current output circuit 22, a resistance circuit 23, a temperature detecting portion 24, and a microcomputer 25. The resistance circuit 23 has a capacitor C1 and resistors R1 and R2.

The switch 20 is provided at a midpoint of the wire 12. The switch 20 is an N-channel FET (Field Effect Transistor). A drain of the switch 20 is connected to the positive electrode of the battery 10 via the wire 12. A source of the switch 20 is connected to one end of the load 11 via the wire 12. A gate of the switch 20 is connected to the control circuit 21. The control circuit 21 is also connected to an output terminal of the current output circuit 22 and the microcomputer 25.

The output terminal of the current output circuit 22 is also connected to one end of each of the resistors R1 and R2 in the resistance circuit 23, and to the microcomputer 25. The other end of the resistor R2 is connected to one end of the capacitor C1 in the resistance circuit 23. The other end of the capacitor C1 and the other end of the resistor R1 are grounded. Thus, in the resistance circuit 23, a series circuit of the capacitor C1 and the resistor R2 is connected in parallel to the resistor R1. The resistors R1 and R2 function as a first resistor and a second resistor, respectively. The temperature detecting portion 24 is also connected to the microcomputer 25.

In the switch 20, if the voltage value at the gate is larger than or equal to a fixed value, a current can flow between the drain and the source. At this time, the switch 20 is ON. In the switch 20, if the voltage value at the gate is smaller than the fixed value, no current flows between the drain and the source. At this time, the switch 20 is OFF. The control circuit 21 turns ON or OFF the switch 20 by adjusting the voltage value at the gate of the switch 20.

An ON signal for giving an instruction to turn ON the switch 20 and an OFF signal for giving an instruction to turn OFF the switch 20 are input from the microcomputer 25 to the control circuit 21. Furthermore, a voltage value at the output terminal of the current output circuit 22 that is based on a ground potential serving as a reference, i.e. an end-to-end voltage value of the voltage across both ends of the resistance circuit 23 is input to the control circuit 21.

In a case where the end-to-end voltage value of the resistance circuit 23 is smaller than a preset reference voltage value, the control circuit 21 turns ON the switch 20 when the ON signal is input from the microcomputer 25. As a result, power is supplied from the battery 10 to the load 11 via the wire 12, and the load 11 operates. In the same case, the control circuit 21 turns OFF the switch 20 when the OFF signal is input from the microcomputer 25. As a result, power supply from the battery 10 to the load 11 is interrupted, and the load 11 stops operation.

If the end-to-end voltage value of the resistance circuit 23 is larger than or equal to the reference voltage value, the control circuit 21 turns OFF the switch 20 regardless of the signal that is input from the microcomputer 25 to the control circuit 21. As a result, power supply from the battery 10 to the load 11 is interrupted, and the load 11 stops operation.

As described above, in the power supply control apparatus 13, power supply from the battery 10 to the load 11 via the wire 12 is controlled as a result of the control circuit 21 turning ON and OFF the switch 20. The control circuit 21 functions as a switch control portion.

The current output circuit 22 outputs a current from its output terminal to the resistance circuit 23, and the current that is output by the current output circuit 22 from the output terminal thereof flows through the resistance circuit 23. The current value of the current output by the current output circuit 22 is in proportion to the wire current value. Specifically, the current value of the current output by the current output circuit 22 is a value obtained by dividing the wire current value by a predetermined number, e.g. 1000. Accordingly, the current value of the current output by the current output circuit 22 increases with an increase in the current value of the current flowing through the wire 12.

In a case where the current output circuit 22 is outputting a current from its output terminal, i.e. a current is flowing through the wire 12, a current flows through the resistor R1 in the resistance circuit 23. In the same case, when the voltage value of the voltage across both ends of the capacitor C1 is smaller than the voltage value of the voltage across both ends of the resistor R1, a current flows through the resistor R2 and the capacitor C1 in this order. Thus, power is stored in the capacitor C1, and the voltage value of the voltage across both ends of the capacitor C1 increases. In the same case, when the voltage value of the voltage across both ends of the capacitor C1 coincides with the voltage value of the voltage across both ends of the resistor R1, no current flows through the series circuit of the capacitor C1 and the resistor R2.

In a case where the current output circuit 22 is not outputting a current from its output terminal, i.e. no current is flowing through the wire 12, the capacitor C1 in the resistance circuit 23 is discharged, and the voltage value of the voltage across both ends of the capacitor C1 decreases. At this time, a current flows from one end of the capacitor C1 to the resistors R1 and R2 in this order, and returns to the other end of the capacitor C1. The end-to-end voltage value of the resistance circuit 23 is input to the microcomputer 25 as well as the control circuit 21.

The resistance value of the resistance circuit 23 depends on the power stored in the capacitor C1. When no power is stored in the capacitor C1, the capacitor C1 acts as a conductor, and then the resistance value of the resistance circuit 23 is a combined resistance value of the resistors R1 and R2 that are connected in parallel. The combined resistance value of the resistors R1 and R2 that are connected in parallel is the smallest resistance value of the resistance circuit 23.

The resistance value of the resistance circuit 23 increases with an increase in the amount of power stored in the capacitor C1. When the voltage value of the voltage across both ends of the capacitor C1 coincides with the voltage value of the voltage across both ends of the resistor R1, no more power is stored in the capacitor C1, and all current output by the current output circuit 22 flows through the resistor R1. At this time, the resistance value of the resistance circuit 23 is the resistance value of the resistor R1. The largest resistance value of the resistance circuit 23 corresponds to the resistance value of the resistor R1.

Figure 2:
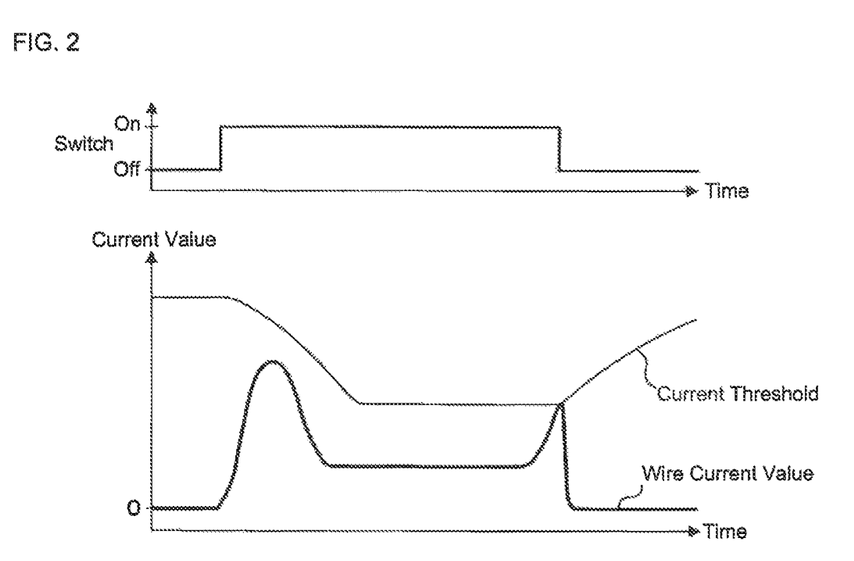
FIG. 2 is a diagram illustrating an effect of a resistance circuit 23.

FIG. 2 is a diagram illustrating an effect of the resistance circuit 23. FIG. 2 shows transition of the switch 20 between ON and OFF, the graph of the wire current value, and the graph of the current threshold of the wire current value. In FIG. 2, the horizontal axis indicates time. The current threshold is a current value of a current that flows through the wire 12 when the end-to-end voltage value of the resistance circuit 23 is the reference voltage value. Accordingly, if the wire current value is smaller than the current threshold, the end-to-end voltage value of the resistance circuit 23 is smaller than the reference voltage value. If the wire current value is larger than or equal to the current threshold, the end-to-end voltage value of the resistance circuit 23 is larger than or equal to the reference voltage value.

As mentioned above, if the end-to-end voltage value of the resistance circuit 23 is larger than or equal to the reference voltage value, the control circuit 21 turns OFF the switch 20. The current value of the current output by the current output circuit 22 is a value obtained by dividing the wire current value by a predetermined number. Accordingly, the current threshold of the wire current value can be expressed as (reference voltage value)×(predetermined number)/(resistance value of the resistance circuit 23). As a result, the smaller the resistance value of the resistance circuit 23, the higher the current threshold.

If the control circuit 21 keeps the switch 20 in an OFF state and no power is stored in the capacitor C1, the resistance value of the resistance circuit 23 is the combined resistance value of the resistors R1 and R2 that are connected in parallel, as mentioned above, and is the smallest value. As a result, the current threshold is largest.

If the control circuit 21 has turned ON the switch 20 from the OFF state, a current flows through the load 11 from the battery 10 via the wire 12, and a current is output from the current output circuit 22 to the resistance circuit 23. Thus, power is stored in the capacitor C1 in the resistance circuit 23, the resistance value of the resistance circuit 23 increases, and the current threshold decreases.

As mentioned above, the resistance value of the load 11 is very small when a current starts to flow, and increases as the current flowing time becomes longer. Then, an inrush current flows through the wire 12 immediately after the control circuit 21 turns ON the switch 20 from the OFF state, and the current value of the current flowing through the wire 12 temporarily increases. The current threshold is sufficiently large immediately after the control circuit 21 turns ON the switch 20 from the OFF state. For this reason, even if an inrush current flows through the wire 12, the end-to-end voltage value of the resistance circuit 23 does not become larger than or equal to the reference voltage value, and the control circuit 21 does not turn OFF the switch 20. Thus, an inrush current is allowed to flow immediately after the control circuit 21 has turned ON the switch 20 from the OFF state.

As mentioned above, if, in the resistance circuit 23, the voltage value of the voltage across both ends of the resistor R1 coincides with the voltage value of the voltage at the capacitor C1, a current flows through only the resistor R1. At this time, the resistance value of the resistance circuit 23 coincides with the resistance value of the resistor R1, and is the largest value. If the resistance value of the resistance circuit 23 coincides with the resistance value of the resistor R1, the current threshold is the smallest value, and is smaller than the current value of the inrush current. The control circuit 21 turns OFF the switch 20 if the wire current value is larger than or equal to the current threshold.

For example, it is assumed that the resistance values of the resistors R1 and R2 are both 4 kΩ, and the reference voltage value and predetermined number is 5 V and 1000, respectively. If no power is stored in the capacitor C1, the resistance value of the resistance circuit 23 is the combined resistance value of the resistors R1 and R2 that are connected in parallel, and therefore is 2 kΩ. At this time, the current threshold is 2.5 A (=5×1000/2000). If the voltage value of the voltage across both ends of the resistor R1 coincides with the voltage value of the voltage across both ends of the capacitor C1, the resistance value of the resistance circuit 23 is the resistance value of the resistor R1, and therefore is 4 kΩ. At this time, the current threshold is 1.25 A (=5×1000/4000).

Accordingly, if the switch 20 in an OFF state is turned ON from the OFF state with no power stored in the capacitor C1, the current threshold gradually decreases from 2.5 A to 1.25 A as time passes. After the current threshold has become 1.25 A, the current threshold does not decrease and is kept at 1.25 A unless the switch 20 turns OFF.

Thus, after an inrush current has flown through the wire 12, the current threshold is kept at the smallest value unless the switch 20 turns OFF from the ON state. Since the current threshold decreases after an inrush current has flown through the wire 12, an abnormal increase in the temperature of the wire 12 due to an overcurrent and occurrence of smoke and fire from the wire 12 due to this abnormal increase in the wire temperature are reliably prevented. After the switch 20 has turned OFF from the ON state, the wire current value becomes 0 A, and the capacitor C1 is discharged. The current threshold increases as the amount of power stored in the capacitor C1 decreases.

A description will be given below of the setting of a capacitance u1 of the capacitor C1 and resistance values r1 and r2 of the respective resistors R1 and R2.

A current value If, with which smoke occurs after a current has flown through the wire 12 t seconds, is calculated using the following equation.

$$If = \sqrt{\frac{Tf - Ta}{Rw \times Rth \times (1 - \exp(-\tau u \times t))}} \qquad \text{[Equation 1]}$$

Constants will now be described. The units of the constants are indicated in brackets. Tf denotes the smoking temperature (° C.) at which the wire 12 emits smoke, and Ta denotes the ambient temperature around the wire 12 (° C.). Rw denotes wire resistance (Ω) of the wire 12, and Rth denotes wire thermal resistance (° C./W) of the wire 12. τu denotes a time constant (s) associated with an increase in the temperature of the wire 12.

A current value Ith, with which the end-to-end voltage value of the resistance circuit 23 becomes a reference voltage value Vr as a result of a current flowing through the wire 12 t seconds, is calculated based on the Kirchhoff's laws, and is expressed as the following equation. N is the aforementioned predetermined number.

$$Ith = \frac{N \times Vr}{r1 \times \left(1 - \frac{r1}{r1 + r2} \times \exp\left(-\frac{1}{u1 \times (r1 + r2)}t\right)\right)} \qquad \text{[Equation 2]}$$

The capacitance u1 and the resistance values r1 and r2 may be set so that the current value Ith becomes as close to the current value If as possible during time t from zero until a predetermined time, within a range in which the current value Ith is smaller than the current value If. The predetermined time is, for example, the time at which the wire current value is stabilized after the switch 20 has turned ON from the OFF state.

The temperature detecting portion 24 shown in FIG. 1 is constituted by a thermistor. The temperature detecting portion 24 detects the ambient temperature around the wire 12, and outputs temperature information that indicates the detected ambient temperature to the microcomputer 25. The ambient temperature around the wire 12 is the temperature in a region around the switch 20, the temperature in the power supply control apparatus 13, or the like.

As mentioned above, the end-to-end voltage value of the resistance circuit 23 and the temperature information are input to the microcomputer 25. Furthermore, the operation signal and stop signal are input to the microcomputer 25. The microcomputer 25 outputs the ON signal or OFF signal to the control circuit 21 based on the signals input to the microcomputer 25, the end-to-end voltage value of the resistance circuit 23, and the temperature information input from the temperature detecting portion 24. As mentioned above, if the end-to-end voltage value of the resistance circuit 23 is smaller than the reference voltage value, the control circuit 21 turns ON the switch 20 when the ON signal is input from the microcomputer 25, and turns OFF the switch 20 when the OFF signal is input from the microcomputer 25.

The microcomputer 25 includes input portions 30, 31, and 32, an output portion 33, an A (Analog)/D (Digital) converting portion 34, a storage portion 35, and a control portion 36. The input portions 30 and 32, the output portion 33, the A/D converting portion 34, the storage portion 35, and the control portion 36 are connected to a bus 37. The A/D converting portion 34 is connected to the input portion 31 as well as to the bus 37. The input portion 31 is also connected to the output terminal of the current output circuit 22. The input portion 32 is also connected to the temperature detecting portion 24. The output portion 33 is also connected to the control circuit 21.

Either the operation signal or the stop signal is input to the input portion 30. The input portion 30 notifies the control portion 36 of the input signal. An analog end-to-end voltage value of the resistance circuit 23 is input to the input portion 31. The input portion 31 outputs the input analog end-to-end voltage value to the A/D converting portion 34. The A/D converting portion 34 converts the analog end-to-end voltage value input from the input portion 31 to a digital end-to-end voltage value. The digital end-to-end voltage value converted by the A/D converting portion 34 is acquired by the control portion 36 from the A/D converting portion 34.

The temperature information is input from the temperature detecting portion 24 to the input portion 32. The temperature information input from the temperature detecting portion 24 to the input portion 32 is acquired by the control portion 36 from the input portion 32. The output portion 33 outputs the ON signal or OFF signal to the control circuit 21 in accordance with an instruction from the control portion 36.

The storage portion unit 35 is a nonvolatile memory. A control program is stored in the storage portion 35. The control portion 36 includes a CPU (Central Processing Unit; not shown), and executes control processing by executing the control program stored in the storage portion 35.

The control portion 36 calculates the wire temperature based on the end-to-end voltage value of the resistance circuit 23 and the ambient temperature around the wire 12 indicated by the temperature information input from the temperature detecting portion 24. As for the calculation of the wire temperature, the control portion 36 cyclically calculates a temperature difference $\Delta Tw$ between the wire temperature and the ambient temperature Ta of the wire 12 indicated by the temperature information input from the temperature detecting portion 24.

Specifically, the control portion 36 calculates a wire current value Iw by calculating (end-to-end voltage value of the resistance circuit 23)×(predetermined number)/(resistance value of resistor R1). The period during which the resistance value of the resistance circuit 23 is smaller than gthe resistance value of the resistor R1 is a short period immediately after the switch 20 has turned ON from the OFF state, and is sufficiently shorter than the period during which the wire temperature is calculated. For this reason, in the calculation of the wire temperature, the resistance value of the resistance circuit 23 may be approximated to the resistance value of the resistor R1. The control portion 36 calculates the temperature difference $\Delta Tw$ by substituting a preceding temperature difference $\Delta Tp$ that was calculated at the previous time, the wire current value Iw, and the ambient temperature Ta around the wire 12 into the following computing equations (1) and (2).

$$\Delta Tw = \Delta Tp \times \exp(-\Delta t/\tau r) + Rth \times Rw \times Iw^2 \times (1 - \exp(-\Delta t/\tau r)) \quad (1)$$

$$Rw = Ro \times (1 + \kappa \times (Ta + \Delta Tp - To)) \quad (2)$$

Variables and constants used in the computing equations (1) and (2) will now be described. In the description of the variables and constants, the units of the variables and constants are also indicated together. As mentioned above, $\Delta Tw$, $\Delta Tp$, Ta, Iw, Rw, and Rth denote the calculated temperature difference (° C.), the preceding temperature difference (° C.), the ambient temperature around the wire 12 (° C.), the calculated wire current value (A), the wire resistance ($\Omega$) of the wire 12, and the wire thermal resistance (° C./W) of the wire 12. $\Delta t$ denotes a cycle (s) of calculation of the temperature difference $\Delta Tw$. $\tau r$ denotes a wire discharge time constant (s) of the wire 12.

To denotes a predetermined temperature (° C.), and Ro denotes wire resistance ($\Omega$) at the temperature To. $\kappa$ denotes a wire resistance/temperature coefficient (/° C.) of the wire 12. The temperature difference $\Delta Tw$, the preceding temperature difference $\Delta Tp$, the wire current value Iw, and the ambient temperature Ta are variables, and the cycle $\Delta t$, the wire discharge time constant $\tau r$, the wire thermal resistance Rth, the wire resistance Ro, the wire resistance/temperature coefficient $\kappa$, and the temperature To are preset constants.

The longer the cycle $\Delta t$, the smaller the value of a first term of the computing equation (1), and therefore, the first term of the computing equation (1) indicates the discharging of the wire 12. Also, the longer the cycle $\Delta t$, the larger the value of a second term of the computing equation (1), and therefore, the second term of the computing equation (1) indicates heat generation of the wire 12.

The control portion 36 calculates the wire temperature by adding the ambient temperature Ta around the wire 12 indicated by the temperature information input from the temperature detecting portion 24, to the calculated temperature difference $\Delta Tw$. The control portion 36 functions as a temperature calculating portion. The preceding temperature difference $\Delta Tp$ is stored in the storage portion 35, and is read out by the control portion 36 from the storage portion 35. The preceding temperature difference $\Delta Tp$ stored in the storage portion 35 is overwritten by the control portion 36.

Figure 3:
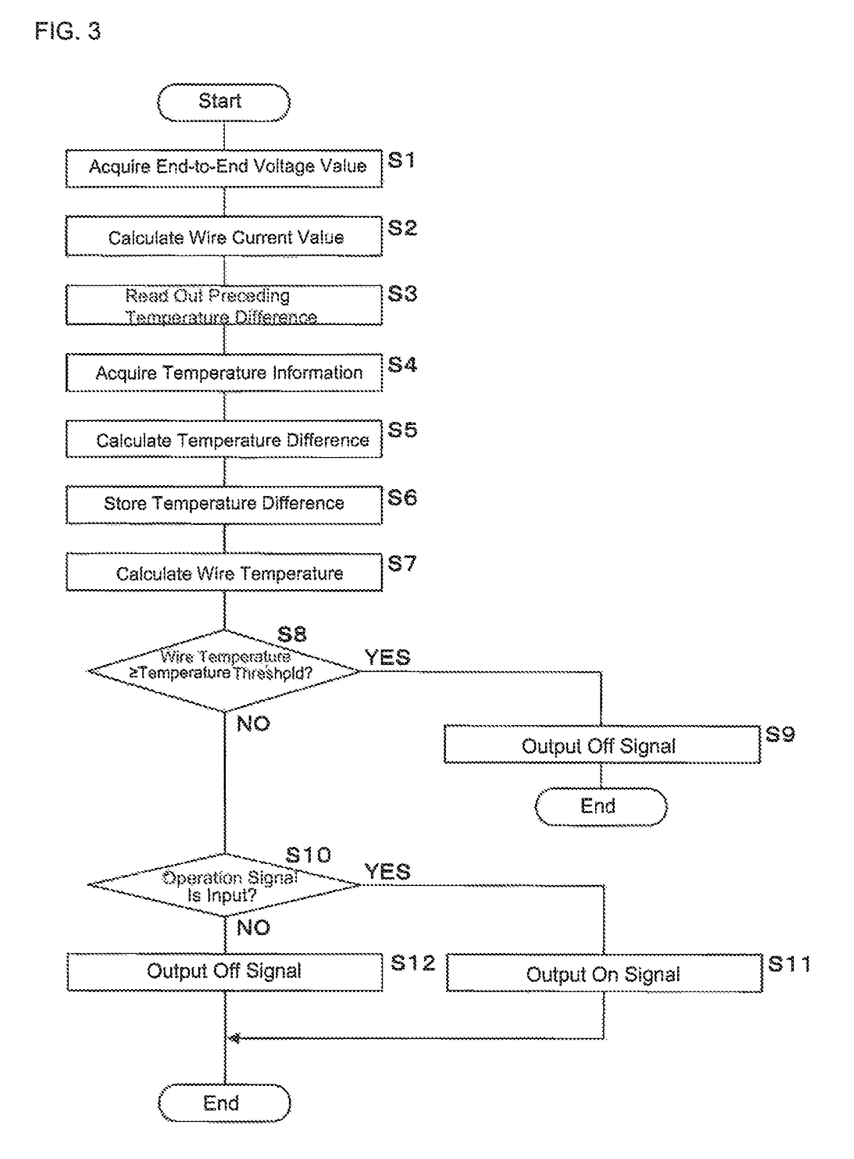
FIG. 3 is a flowchart showing a procedure of control processing executed by a control portion.

FIG. 3 is a flowchart showing a procedure of control processing executed by the control portion 36. The control processing includes wire temperature calculation, which is performed by adding the ambient temperature Ta around the wire 12 to the temperature difference ΔTw. The control portion 36 cyclically executes the control processing unless the calculated wire temperature is larger than or equal to a temperature threshold.

The control portion 36 first acquires the end-to-end voltage value of the resistance circuit 23 from the A/D converting portion 34 (step S1). The end-to-end voltage value acquired in step S1 substantially coincides with the end-to-end voltage value of the resistance circuit 23 at the time when step S1 is executed. Next, the control portion 36 calculates the wire current value by calculating (end-to-end voltage value acquired in step S1)×(predetermined number)/(resistance value of the resistor R1) (step S2).

After executing step S2, the control portion 36 reads out the preceding temperature difference ΔTp that was calculated at the previous time from the storage portion 35 (step S3), and acquires, from the input portion 32, the temperature information input from the temperature detecting portion 24 to the input portion 32 (step S4). The ambient temperature Ta around the wire 12 indicated by the temperature information acquired by the control portion 36 from the temperature detecting portion 24 substantially coincides with the ambient temperature Ta around the wire 12 that is detected by the temperature detecting portion 24 when the control portion 36 acquires the temperature information.

Next, the control portion 36 calculates the temperature difference ΔTw between the wire temperature and the ambient temperature Ta around the wire 12 by substituting the wire current value Iw calculated in step S2, the preceding temperature difference ΔTp read out in step S3, and the ambient temperature Ta around the wire 12 indicated by the temperature information acquired in step S4 into the aforementioned computing equations (1) and (2) (step S5). Here, the cycle Δt is a cycle of the control processing that is repeatedly executed. Since the control processing is cyclically executed as mentioned above, the temperature difference ΔTw is calculated in time series (chronologically) by the control portion 36.

Next, the control portion 36 stores, as the preceding temperature difference ΔTp, the temperature difference ΔTw calculated in step S5 in the storage portion 35 (step S6). The preceding temperature difference ΔTp stored in step S6 is used in step S5 when it is executed the next time.

After executing step S6, the control portion 36 calculates the wire temperature by adding the ambient temperature around the wire 12 indicated by the temperature information acquired in step S4 to the temperature difference calculated in step S5 (step S7). Next, the control portion 36 determines whether or not the wire temperature calculated in step S7 is larger than or equal to the temperature threshold (step S8). The temperature threshold is a fixed value and is stored in advance in the storage portion 35.

If it is determined that the wire temperature is larger than or equal to the temperature threshold (S8: YES), the control portion 36 instructs the output portion 33 to output the OFF signal to the control circuit 21 (step S9). As a result, the control circuit 21 turns OFF the switch 20, and power supply from the battery 10 to the load 11 is interrupted.

As described above, the control circuit 21 turns OFF the switch 20 if the wire temperature calculated by the control portion 36 is larger than or equal to the temperature threshold. Accordingly, even if the wire current value of the current flowing through the wire 12 is smaller than the current threshold, the switch 20 turns OFF from the ON state if the wire temperature is larger than or equal to the temperature threshold. Thus, an abnormal increase in the temperature of the wire 12 and occurrence of smoke and fire from the wire 12 due to the abnormal increase in the wire temperature are more reliably prevented.

After executing step S9, the control portion 36 ends the control processing. Thereafter, the control portion 36 does not execute the control processing again until predetermined conditions are satisfied, e.g. the stop signal is input to the input portion 30 and the operation signal is again input thereto.

If it is determined that the wire temperature is smaller than the temperature threshold (S8: NO), the control portion 36 determines whether or not the operation signal is input to the input portion 30 (step S10). If it is determined that the operation signal is input to the input portion 30 (S10: YES), the control portion 36 instructs the output portion 33 to output the ON signal to the control circuit 21 (step S11). As a result, the control circuit 21 turns ON the switch 20, and power supply from the battery 10 to the load 11 starts.

If it is determined that the operation signal is not input to the input portion 30, i.e. the stop signal is input to the input portion 30 (S10: NO), the control portion 36 instructs the output portion 33 to output the OFF signal to the control circuit 21 (step S12). As a result, the control circuit 21 turns OFF the switch 20, and power supply from the battery 10 to the load 11 is interrupted. After executing step S11 or step S12, the control portion 36 ends the control processing. If the next cycle has been reached, the control portion 36 again executes the control processing.

Embodiment 2

Figure 4:
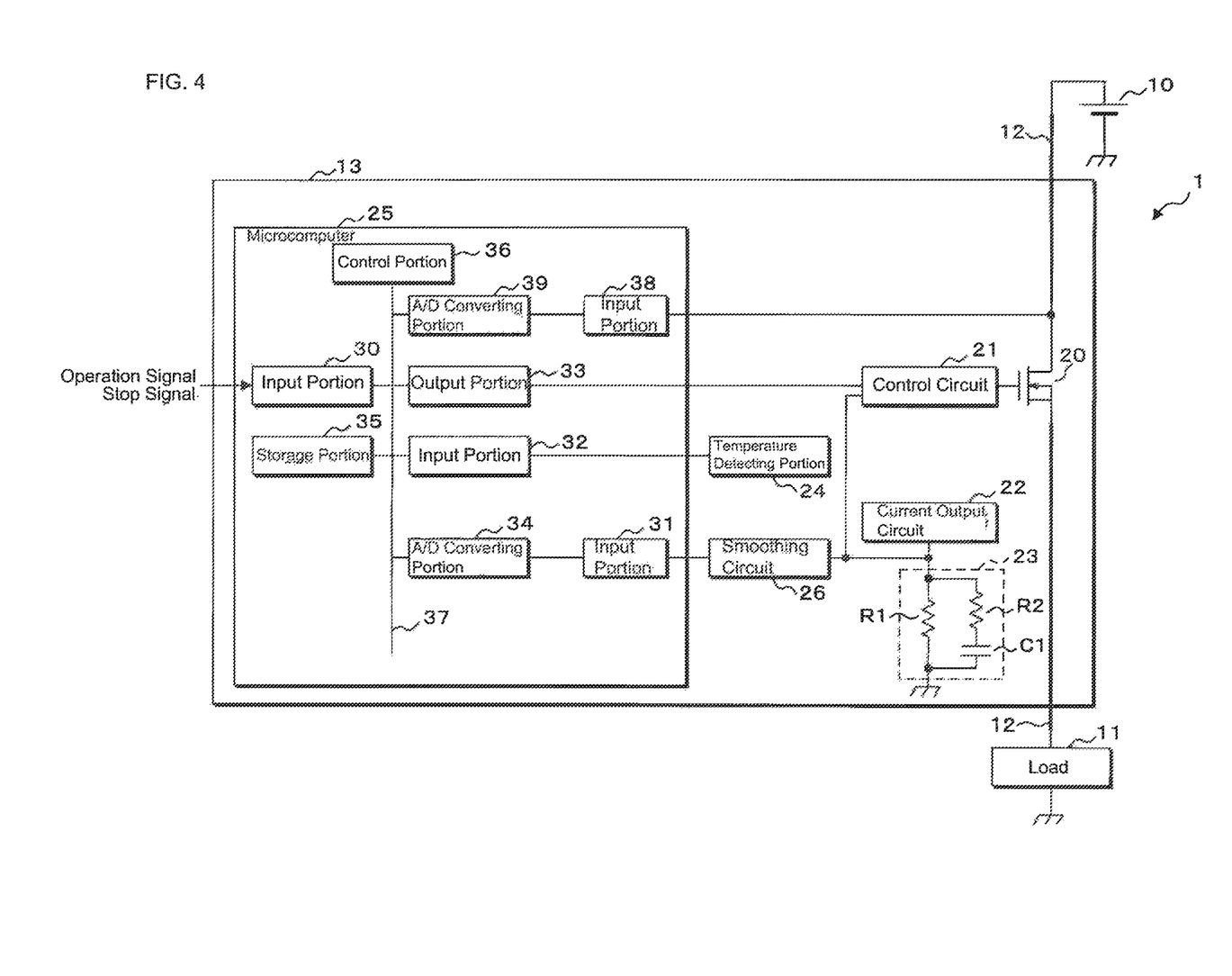
FIG. 4 is a block diagram showing a configuration of essential parts of a power supply system according to Embodiment 2.

FIG. 4 is a block diagram showing a configuration of essential parts of the power supply system 1 according to Embodiment 2. Embodiment 2 will be described below regarding differences from Embodiment 1. Since the structures other than those described below are the same as those in Embodiment 1, the same structures as those in Embodiment 1 are assigned the same reference numerals as those in Embodiment 1, and descriptions thereof are omitted.

The power supply system 1 according to Embodiment 2 is also favorably mounted in a vehicle. The battery 10, the load 11, the wire 12, and the power supply control apparatus 13 are connected in the same manner as in Embodiment 1.

The power supply control apparatus 13 according to Embodiment 2 includes a smoothing circuit 26, in addition to the structures included in the power supply control apparatus 13 according to Embodiment 1. The battery 10, the load 11, the wire 12, the switch 20, the control circuit 21, the current output circuit 22, and the resistance circuit 23 are connected in the same manner as in Embodiment 1. The microcomputer 25 is connected separately to the control circuit 21 and the temperature detecting portion 24, and is also connected to the drain of the switch 20. The output terminal of the current output circuit 22 is also connected to the smoothing circuit 26. The smoothing circuit 26 is connected to the microcomputer 25 as well as to the output terminal of the current output circuit 22.

Since the control circuit 21, the current output circuit 22, and the resistance circuit 23 operate similarly to Embodiment 1, an inrush current is allowed to flow immediately after the control circuit 21 turns ON the switch 20 from the OFF state. Also, since the current threshold decreases after an inrush current has flown through the wire 12, an abnormal increase in the temperature of the wire 12 due to an overcurrent and occurrence of smoke and fire from the wire 12 due to the abnormal increase in the wire temperature are reliably prevented.

The smoothing circuit 26 smooths the voltage across both ends of the resistance circuit 23. The smoothed voltage value, i.e. the voltage value of the voltage smoothed by the smoothing circuit 26 is input to the input portion 31 in the microcomputer 25.

Figure 5:
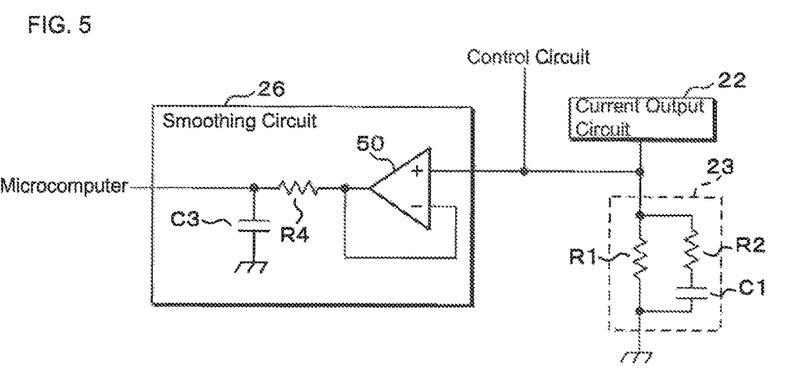
FIG. 5 is a circuit diagram of a smoothing circuit.

FIG. 5 is a circuit diagram of the smoothing circuit 26. The smoothing circuit 26 has an op-amp 50, a capacitor C3, and a resistor R4. The op-amp 50 has a plus terminal, a minus terminal, and the output terminal. The plus terminal of the op-amp 50 is connected to the output terminal of the current output circuit 22. The output terminal of the op-amp 50 is connected to the minus terminal of the op-amp 50 and one end of the resistor R4. The other end of the resistor R4 is connected to the microcomputer 25 and one end of the capacitor C3. The other end of the capacitor C3 is grounded.

The op-amp 50 functions as a so-called voltage follower circuit. The op-amp 50 outputs the voltage across both ends of the resistance circuit 23 that is input to the plus terminal, as-is, from the output terminal. Since the input impedance at the plus terminal of the op-amp 50 is very high, operations of the circuits connected to the output terminal of the op-amp 50 do not affect the circuits connected to the plus terminal of the op-amp 50.

A CR filter, which is constituted by the capacitor C3 and the resistor R4, smooths the voltage output from the output terminal of the op-amp 50, i.e. the voltage across both ends of the resistance circuit 23. The CR filter constituted by the capacitor C3 and the resistor R4 outputs the smoothed voltage value of the voltage smoothed thereby to the microcomputer 25. The CR time constant of the CR filter constituted by the capacitor C3 and the resistor R4 is larger than the CR time constant of the capacitor C1 and the resistor R2 in the resistance circuit 23. When the load 12 is operating, the smoothed voltage value does not significantly vary due to the turning ON and OFF of the switch 20, and is substantially fixed. When the load 12 stops operating, i.e. the switch 20 is kept in the OFF state, the smoothed voltage value is 0 V.

The output voltage value of the battery 10 (hereinafter referred to as "battery voltage value") is input to the microcomputer 25 shown in FIG. 4 from the drain of the switch 20. The microcomputer 25 outputs the ON signal or OFF signal to the control circuit 21 based on the signals input from the outside, the battery voltage value, the load voltage value, the smoothed voltage value, and the temperature information.

The microcomputer 25 according to Embodiment 2 has an input portion 38 and an A/D converting portion 39, in addition to the structures included in the microcomputer 25 according to Embodiment 1. The input portions 30, 31, and 32, the output portion 33, the A/D converting portion 34, the storage portion 35, the control portion 36, and the bus 37 are connected in the same manner as in Embodiment 1. The input portions 31 and 32 and the output portion 33 are also connected to the smoothing circuit 26, the temperature detecting portion 24, and the control circuit 21.

The A/D converting portion 39 is also connected to the bus 37. The A/D converting portion 39 is connected to the input portion 38 as well as the bus 37. The input portion 38 is also connected to the drain of the switch 20.

An analog smoothed voltage value is input from the smoothing circuit 26 to the input portion 31. The input portion 31 outputs the input analog smoothed voltage value to the A/D converting portion 34. The A/D converting portion 34 converts the analog smoothed voltage value input from the input portion 31 to a digital smoothed voltage value. The digital smoothed voltage value converted by the A/D converting portion 34 is acquired by the control portion 36 from the A/D converting portion 34.

An analog battery voltage value is input from the drain of the switch 20 to the input portion 38. The input portion 38 outputs the input analog battery voltage value to the A/D converting portion 39. The A/D converting portion 39 converts the analog battery voltage value input from the input portion 38 to a digital battery voltage value. The digital battery voltage value converted by the A/D converting portion 39 is acquired by the control portion 36 from the A/D converting portion 39.

The control portion 36 executes control processing and power supply processing, through which power is supplied to the load 11 as a result of causing the control circuit 21 to perform PWM (Pulse Width Modulation) control regarding the turning ON and OFF of the switch 20, by executing the control program stored in the storage portion 35, similarly to Embodiment 1.

In the power supply processing, the control portion 36 instructs the output portion 33 to alternately output the ON signal and OFF signal to the control circuit 21. Thus, if the end-to-end voltage value of the resistance circuit 23 is smaller than a reference voltage, the control circuit 21 alternately turns ON and OFF the switch 20. In the power supply processing, the control portion 36 cyclically switches the signal to be output by the output portion 33 from the ON signal to the OFF signal, or from the OFF signal to the ON signal.

The control portion 36 acquires the battery voltage value from the A/D converting portion 39. The battery voltage value acquired by the control portion 36 from the A/D converting portion 39 substantially coincides with the battery voltage value at the time when the control portion 36 acquires the battery voltage value. The control portion 59 calculates the ratio of an ON period during which the switch 20 is kept in the ON state to one cycle, i.e. the duty ratio, based on the battery voltage value acquired from the A/D converting portion 39. The duty ratio is larger than or equal to 0, and is smaller than or equal to 1. The higher the duty ratio, the longer the ON period of the switch 20, and accordingly, the higher the average value of the voltage value of the voltage applied to the load 11. The duty ratio is calculated by dividing the average value of the voltage value of the voltage applied to the load 11 by the battery voltage value.

The average value of the voltage value of the voltage that is to be applied to the load 11 is stored, as a target voltage value, in advance in the storage portion 35. The control portion 36 calculates the duty ratio by dividing the target voltage value by the battery voltage value acquired from the A/D converting portion 39. The control portion 36 stores the calculated duty ratio in the storage portion 35. The control portion 36 causes the output portion 33 to output the ON signal and OFF signal in accordance with the duty ratio stored in the storage portion 35. Thus, if the end-to-end voltage value of the resistance circuit 23 is smaller than the reference voltage, the control circuit 21 alternately repeats tuning ON and OFF of the switch 20. Power is supplied from the battery 10 to the load 11 as a result of the control circuit 21 thus turning ON and OFF the switch 20.

In the power supply processing, the control portion 36 regularly executes the calculation of the duty ratio associated with the turning ON and OFF of the switch 20, and regularly updates the duty ratio stored in the storage portion 35. The control portion 36 executes the control processing and power supply processing in parallel.

In the control processing according to Embodiment 2 as well, the control portion 36 calculates the wire temperature, similarly to Embodiment 1. In the control processing according to Embodiment 2, the control portion 36 cyclically calculates the temperature difference between the temperature of the wire 12 and the ambient temperature around the wire 12 detected by the temperature detecting portion 24, based on the duty ratio stored in the storage portion 35, the smoothed voltage value acquired from the A/D converting portion 34, the ambient temperature around the wire 12 indicated by the temperature information that is input from the temperature detecting portion 24 to the input portion 32, and the preceding temperature difference that was calculated at the previous time.

Figure 6:
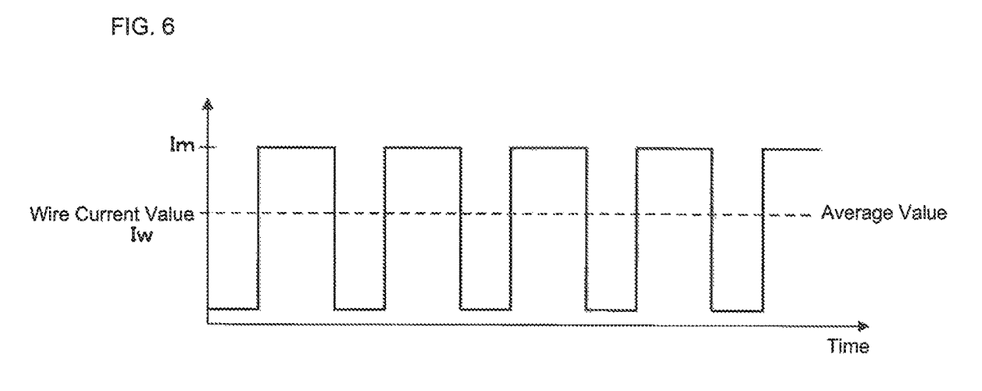
FIG. 6 is a waveform diagram of a wire current value when a load is operated.

A description will be given below of equations used in the calculation of the temperature difference between the temperature of the wire 12 and the ambient temperature around the wire 12. FIG. 6 is a waveform diagram of the wire current value Iw when the load 11 is operated. In FIG. 6, the horizontal axis indicates time. FIG. 6 shows the actual wire current value Iw. If the power supply processing is executed and the load 11 is operating, the switch 20 is cyclically turned ON and OFF, and accordingly, the waveform of the wire current value Iw is pulsatile. Each pulse has a rectangular shape and has the same current value, and this current value will be expressed as a current value Im below.

Note that an inrush current flows through the wire 12 if the switch 20 has turned ON from the OFF state, but the period during which the inrush current flows is sufficiently short relative to the ON period of the switch 20, and the current value of the inrush current can be approximated to the current value Im. Therefore, the inrush current is omitted in the diagram. The current value Im is a current value that converges after an inrush current has flown through the wire 12.

$Iw^2$ in the aforementioned computing equation (1) is expressed as follows, using the current value Im and the duty ratio D associated with the turning ON and OFF of the switch 20.

$$Iw^2 = Im^2 \times D \quad (3)$$

The average value of the wire current value Iw is expressed as Im×D. Since the smoothing circuit 26 smooths the voltage across both ends of the resistance circuit 23, the smoothed voltage value Vs is in proportion to the average value of the wire current value Iw. Therefore, the following equation (4) holds.

$$Im \times D = \alpha \times Vs \quad (4)$$

Here, α is a constant.

The following equation (5) is derived by eliminating the current value Im from the equations (3) and (4).

$$Iw^2 = \alpha^2 \times Vs^2 / D \quad (5)$$

The following computing equation (6) is derived by eliminating the wire current value Iw from the computing equations (1) and (5).

$$\Delta Tw = \Delta Tp \times \exp(-\Delta t/\tau r) + \alpha^2 \times Rth \times Rw \times Vs^2 \times (1 - \exp(-\Delta t/\tau r))/D \quad (6)$$

Since $\alpha^2 \times Rth$ is a constant, the following computing equation (7) is derived by replacing $\alpha^2 \times Rth$ with a constant A in the computing equation (6).

$$\Delta Tw = \Delta Tp \times \exp(-\Delta t/\tau r) + A \times Rw \times Vs^2 \times (1 - \exp(-\Delta t/\tau r))/D \quad (7)$$

The computing equations (2) and (7) are used in the calculation of the wire temperature according to Embodiment 2. The unit of the smoothed voltage value Vs is volt (V). The duty ratio D is a ratio and does not have a unit. If the load 11 has stopped operation, the smoothed voltage value Vs is 0 V as mentioned above, and accordingly, the temperature difference ΔTw decreases every time a cycle Δt has passed.

Figure 7:
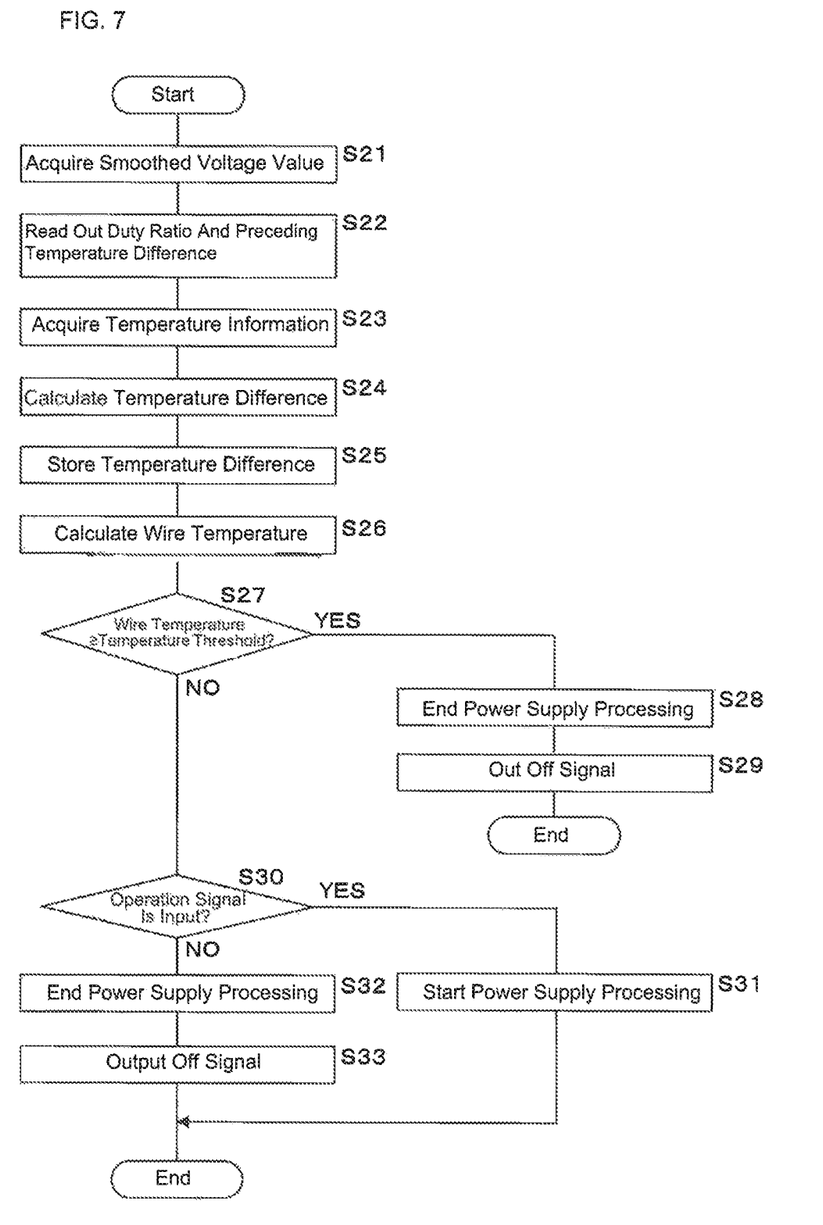
FIG. 7 is a flowchart showing a procedure of control processing executed by the control portion.

FIG. 7 is a flowchart showing a procedure of control processing performed by the control portion 36. The control portion 36 cyclically executes the control processing unless the calculated wire temperature is larger than or equal to the temperature threshold, similarly to Embodiment 1.

First, the control portion 36 acquires the smoothed voltage value from the A/D converting portion 34 (step S21). The smoothed voltage value acquired by the control portion 36 substantially coincides with the smoothed voltage value output from the smoothing circuit when the control portion 36 acquires the smoothed voltage value. Next, the control portion 36 reads out, from the storage portion 35, the duty ratio D associated with the turning ON and OFF of the switch 20 and the preceding temperature difference ΔTp that was calculated at the previous time (step S22), and acquires, from the input portion 32, the temperature information input from the temperature detecting portion 24 to the input portion 32 (step S23).

Next, the control portion 36 calculates the temperature difference ΔTw between the wire temperature and the ambient temperature Ta around the wire 12 by substituting, into the computing equations (2) and (7), the smoothed voltage value Vs acquired in step S21, the duty ratio D and the preceding temperature difference ΔTp read out in step S22, and the ambient temperature Ta around the wire 12 indicated by the temperature information acquired in step S23 (step S24). Here, the cycle Δt is a cycle of the control processing that is repeatedly executed. Since the control processing is cyclically executed as mentioned above, the temperature difference ΔTw is calculated in time series by the control portion 36. The control portion 36 also functions as a temperature difference calculating portion.

Next, the control portion 36 stores the temperature difference ΔTw calculated in step S24 as the preceding temperature difference ΔTp in the storage portion 35 (step S25). The preceding temperature difference ΔTp stored in step S25 is used in step S24 when it is executed the next time. After executing step S25, the control portion 36 calculates the wire temperature by adding the ambient temperature around the wire 12 indicated by the temperature information acquired in step S23 to the temperature difference calculated in step S24 (step S26).

Next, the control portion 36 determines whether or not the wire temperature calculated in step S26 is larger than or equal to the temperature threshold (step S27). If it is determined that the wire temperature is larger than or equal to the temperature threshold (S27: YES), the control portion 36 ends the power supply processing (step S28). The power supply processing is started by the control portion 36 if the operation signal is input to the input portion 30, as will be described later. After executing step S28, the control portion 36 instructs the output portion 33 to output the OFF signal to the control circuit 21 (step S29). As a result, the control circuit 21 turns OFF the switch 20, and power supply from the battery 10 to the load 11 is interrupted. Note that, if the power supply processing has not been executed when step S28 is executed, the control portion 36 executes step S29 without executing step S28.

After executing step S29, the control portion 36 ends the control processing. If the control portion 36 executes step S29 and ends the control processing, the control portion 36 does not execute the control processing again until predetermined conditions are satisfied.

If it is determined that the wire temperature is smaller than the temperature threshold (S27: NO), the control portion 36 determines whether or not the operation signal is input to the input portion 30 (step S30). If it is determined that the operation signal is input to the input portion 30 (S30: YES), the control portion 36 starts the power supply processing (step S31). In the power supply processing, as mentioned above, the control circuit 21 alternately repeats the turning ON and OFF of the switch 20, and power is supplied from the battery 10 to the load 11. After executing step S31, the control portion 36 ends the control processing. If the control portion 36 executes step S31 and ends the control processing, the control portion 36 executes the control processing again when the next cycle is reached. Note that, if the power supply processing has been executed when step S28 is executed, the control portion 36 ends the control processing without executing step S31.

If it is determined that the operation signal is not input to the input portion 30, i.e. the stop signal is input to the input portion 30 (S30: NO), the control portion 36 ends the power supply processing (step S32) and instructs the output portion 33 to output the OFF signal to the control circuit 21 (step S33). As a result, the control circuit 21 turns OFF the switch 20, and power supply from the battery 10 to the load 11 is interrupted. Note that, if the power supply processing has not been executed when step S32 is executed, the control portion 36 executes step S33 without executing step S32.

After executing step S33, the control portion 36 ends the control processing. If the control portion 36 executes step S33 and ends the control processing, the control portion 36 executes the control processing again when the next cycle is reached.

In the power supply control apparatus 1 according to Embodiment 2 that is configured as described above, the switch 20 turns OFF from the ON state if the wire temperature is smaller than or equal to the temperature threshold, even if the wire current value is smaller than the current threshold. Accordingly, it is possible to more reliably prevent an abnormal increase in the temperature of the wire 12, and occurrence of smoke and fire from the wire 12 due to this abnormal increase in the wire temperature. As described above, the control portion 36 calculates the temperature difference between the wire temperature and the ambient temperature of the wire 12 by substituting the smoothed voltage value of the voltage smoothed by the smoothing circuit 26 into the computing equations (2) and (7). For this reason, the control portion 36 can calculate an appropriate wire temperature even if the turning ON and OFF of the switch 20 is alternately repeated.

Note that, in Embodiment 2, the configuration in which the duty ratio associated with the turning ON and OFF of the switch 20 is adjusted is not limited to a configuration in which the duty ratio is adjusted based on the battery voltage value. For example, a configuration in which the duty ratio is adjusted based on the voltage value that is output from the switch 20 to the load 11 may also be employed. Furthermore, the duty ratio associated with the turning ON and OFF of the switch 20 may also be a fixed value.

The configuration for calculating the wire temperature is not limited to a configuration in which the temperature difference between the wire temperature and the ambient temperature around the wire 12 is calculated, and the ambient temperature around the wire 12 is added to the calculated temperature difference. Any configuration in which the wire temperature is calculated based on the smoothed voltage value of the voltage smoothed by the smoothing circuit 26 may be employed. Furthermore, the switch 20 is not limited to an N-channel FET, and may also be a P-channel FET, a bipolar transistor, or the like.

Embodiments 1 and 2 disclosed above are examples in all aspects, and should be considered to be non-restrictive. The scope of the present description is indicated not by the above-stated meanings but by the claims, and is intended to include all modifications within the meanings and scope equivalent to the claims.

LIST OF REFERENCE NUMERALS

1 Power supply control apparatus
12 Electric wire
20 Switch
21 Control circuit (switch control portion)
22 Current output circuit
23 Resistance circuit
24 Temperature detecting portion
26 Smoothing circuit
36 Control portion (temperature calculating portion, temperature difference calculating portion)
C1 Capacitor
R1 Resistor (first resistor)
R2 Resistor (second resistor)

The invention claimed is:

1. A power supply control apparatus that includes a switch control portion that turns ON or OFF a switch provided at a midpoint of a wire, and controls power supplied via the wire by switching with the switch control portion, the power supply control apparatus comprising:
a current output circuit for outputting a current corresponding to a current flowing through the wire; and
a resistance circuit through which the current output by the current output circuit flows,
wherein the resistance circuit includes:
a first resistor; and
a series circuit of a second resistor and a capacitor that are connected in parallel to the first resistor, the resistance circuit connected in series with the current output circuit and is grounded, and
the switch control portion turns OFF the switch if an end-to-end voltage value of a voltage across both ends of the resistance circuit, the end-to-end voltage value being based on a ground potential that serves as a reference, is larger than or equal to a predetermined voltage value.

2. The power supply control apparatus according to claim 1, further comprising:
a temperature calculating portion for calculating a wire temperature of the wire based on the end-to-end voltage value,
wherein the switch control portion turns OFF the switch if the wire temperature calculated by the temperature calculating portion is larger than or equal to a predetermined temperature.

3. The power supply control apparatus according to claim 1, further comprising:
a smoothing circuit for smoothing a voltage across both ends of the resistance circuit; and
a temperature calculating portion for calculating a wire temperature of the wire based on a voltage value of the voltage smoothed by the smoothing circuit, wherein the switch control portion turns OFF the switch if the wire temperature calculated by the temperature calculating portion is larger than or equal to a predetermined temperature.

4. The power supply control apparatus according to claim 3, further comprising:
a temperature detecting portion for detecting an ambient temperature around the wire, wherein the temperature calculating portion has a temperature difference calculating portion for calculating, in time series, a temperature difference between the wire temperature and the ambient temperature detected by the temperature detecting portion, and calculates the wire temperature by adding the ambient temperature detected by the temperature detecting portion to the temperature difference calculated by the temperature difference calculating portion,
the switch control portion alternately repeats the turning ON and OFF the switch, and
the temperature difference calculating portion calculates a temperature difference ($\Delta$Tw) by substituting, into the equations below, a voltage value (Vs) of the voltage smoothed by the smoothing circuit, an ambient temperature (Ta) detected by the temperature detecting portion, a duty ratio (D) associated with the turning ON and OFF of the switch, and a preceding temperature difference ($\Delta$Tw) that is calculated at a previous time:

$$\Delta Tw = (\Delta Tp) \times \exp(-\Delta t/\tau r) + A \times Rw \times Vs^2 \times (1-\exp(-\Delta t/\tau r))/D$$

$$Rw = Ro \times (1 + \kappa \times (Ta + \Delta Tp - To))$$

where $\Delta t$ denotes a time interval of calculation performed by the temperature difference calculating portion,
Ro denotes a wire resistance value at a predetermined temperature (To),
$\tau r$ denotes a wire discharge time constant of the wire,
$\kappa$ denotes a wire resistance/temperature coefficient of the wire, and
A denotes a constant.

* * * * *